United States Patent [19]
Daikoku et al.

[11] Patent Number: 5,751,062
[45] Date of Patent: May 12, 1998

[54] COOLING DEVICE OF MULTI-CHIP MODULE

[75] Inventors: Takahiro Daikoku, Ushiku; Fumiyuki Kobayashi, Sagamihara; Noriyuki Ashiwake, Tsuchiura; Kenichi Kasai, Ushiku; Keizou Kawamura, Ibaraki-ken; Akio Idei, Hadano, all of Japan

[73] Assignee: Hitachi, Ltd., Tokyo, Japan

[21] Appl. No.: 571,711

[22] Filed: Dec. 13, 1995

[30] Foreign Application Priority Data

Dec. 15, 1994 [JP] Japan ................... 6-333389

[51] Int. Cl.$^6$ .................................... H01L 23/367
[52] U.S. Cl. ................. 257/722; 257/713; 257/718; 257/719; 257/724
[58] Field of Search ................. 257/713, 718, 257/719, 722, 724

[56] References Cited

U.S. PATENT DOCUMENTS

| | | |
|---|---|---|
| 4,649,990 | 3/1987 | Kurihara et al. |
| 5,276,289 | 1/1994 | Satoh et al. |
| 5,345,107 | 9/1994 | Daikoku ................... 257/719 |
| 5,585,671 | 12/1996 | Nagesh ................... 257/713 |

FOREIGN PATENT DOCUMENTS

| | | |
|---|---|---|
| 0169270 | 1/1986 | European Pat. Off. |
| 0344084 | 11/1989 | European Pat. Off. |
| 0644593A2 | 3/1995 | European Pat. Off. |
| 53-53547 | 5/1978 | Japan . |
| 62-249429 | 10/1987 | Japan . |
| 1217951 | 8/1989 | Japan ................... 257/719 |
| 02028351 | 1/1990 | Japan . |
| 02106956 | 4/1990 | Japan . |
| 03178154 | 8/1991 | Japan . |
| 3185854 | 8/1991 | Japan ................... 257/719 |
| 03253063 | 11/1991 | Japan . |
| 04315456 | 11/1992 | Japan . |
| 5-78183 | 10/1993 | Japan . |

*Primary Examiner*—Jerome Jackson
*Attorney, Agent, or Firm*—Fay, Sharpe, Beall, Fagan, Minnich & McKee

[57] ABSTRACT

A cooling device of a multi-chip module has micropackages that are independent of thermal deformation and easy to assembly and disassembly. The multi-chip module includes a multi-layer substrate on which the micropackages, each encasing an LSI chip, are mounted, and a housing formed integrally with a cooler. Each of the micropackages includes a first heat conduction member, having a cap portion for receiving the LSI chip and a first fin made of the same material as the cap portion to be integral therewith, and a substrate fixed to the cap portion of the first heat conduction member, the LSI chip being mounted on the substrate which is securely fixed to the cap portion of the heat conduction member while being fixedly joined at the back surface thereof to an inner surface of the cap portion of the first heat conduction member. Second heat conduction members, each including a base portion and a second fin, are disposed to engage with the first fins and be pressed against the cooler by a spring, respectively.

14 Claims, 5 Drawing Sheets

COOLING DEVICE OF MULTI-CHIP MODULE

BACKGROUND OF THE INVENTION

This invention relates to a cooling device of a multi-chip module on which a large number of micropackages, each encasing or incorporating therein a semiconductor integrated circuit chip, are mounted, and more particularly to a cooling device for removing heat generated by a chip which is highly integrated, highly concentrated in heat-generation source or element density (hereafter referred to as "heat-generation density"), and increased in size so as to be used in a large-scale computer or a super computer.

Since high processing speed is demanded of the large-scale computer and the super computer, a large-scale integrated circuit (hereinafter abbreviated to LSI) to be used in such computers has been changing in recent years to be highly integrated, highly concentrated in heat-generation density and increased in size. On the other hand, the length of the wiring, interconnecting the LSIs, must be as short as possible for high-speed transmission of signals, and therefore there is adopted a multi-chip module structure in which a large number of LSIs are mounted on a multi-layer substrate.

In a cooling device for removing heat generated by this kind of LSI in a multi-chip module, there is generally formed a flexible heat conduction path between the LSI and the cooling member. This flexible heat conduction path is necessary for moderating the accuracy of fabricating or finishing and the accuracy of assembling of the cooling device, and for securing the connection reliability of the LSI.

Figure 7:
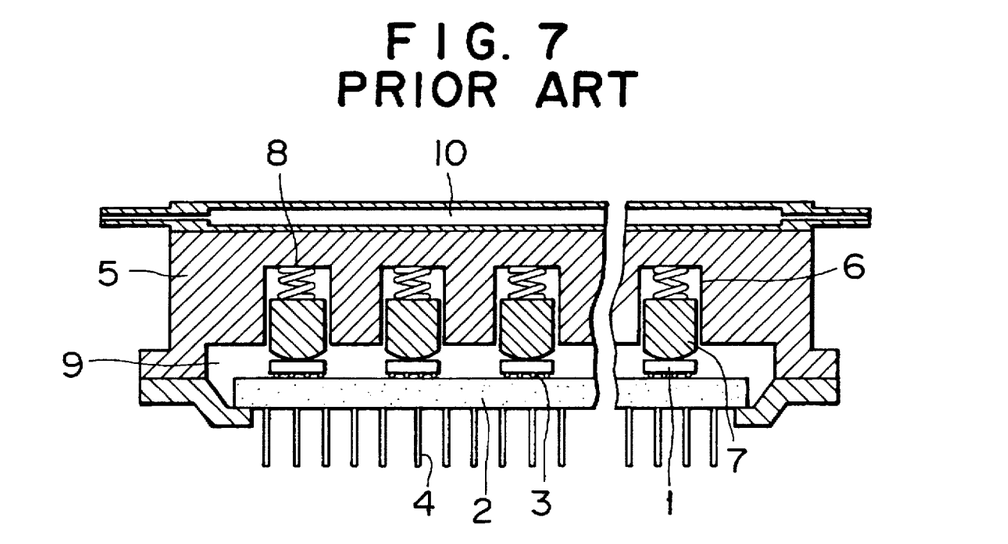
FIG. 7 is a cross-sectional view showing essential portions of a conventional cooling device of a multi-chip module.

For example, Japanese Patent Unexamined Publication No. 52-53547 discloses a heat conduction path as shown in FIG. 7.

In this conventional example, a housing 5 is attached to a multi-layer substrate 2 so as to cover a large number of LSI chips 1 mounted on the multi-layer substrate 2 by means of small solder balls 3, the housing 5 being formed with cylinders 6 at positions corresponding to the respective LSI chips. In each of the cylinders 6 are inserted a piston-like thermal conductor or heat conduction member 7 which conducts, or allows to dissipate, heat generated by the LSI from the back surface of the LSI chip 1, and a spring 8 which applies a pushing pressure to the heat conduction member 7.

In this case, the piston-like heat conduction member 7 can move within the cylinder 6 so that a flexible heat conduction path is formed. Further, the tip or distal end of the heat conduction member 7 is formed in a spherical shape so that, even if the LSI chip 1 is mounted with an inclination, contact of the LSI chip 1 with the heat conduction member 7 is ensured at all times.

Meanwhile, the cooling efficiency or performance of the flexible heat conduction path is secured by filling an enclosed space 9, defined by the multi-layer substrate 2 and the housing 5, with highly thermally conductive helium gas. More specifically, the heat generated by the LSI chip 1 is transferred to the heat conduction member 7 through a helium gas layer present at the contact portion between the piston-like heat conduction member 7 and the back surface of the LSI chip 1. Further, the heat is transmitted through the helium gas in the gap defined between the piston-like heat conduction member 7 and the cylinder 6 to be conducted to the housing 5. Then, the heat is finally removed by cooling or cold water or cooling air flowing through a cooler 10 provided at the top of the housing 5.

Figure 8:
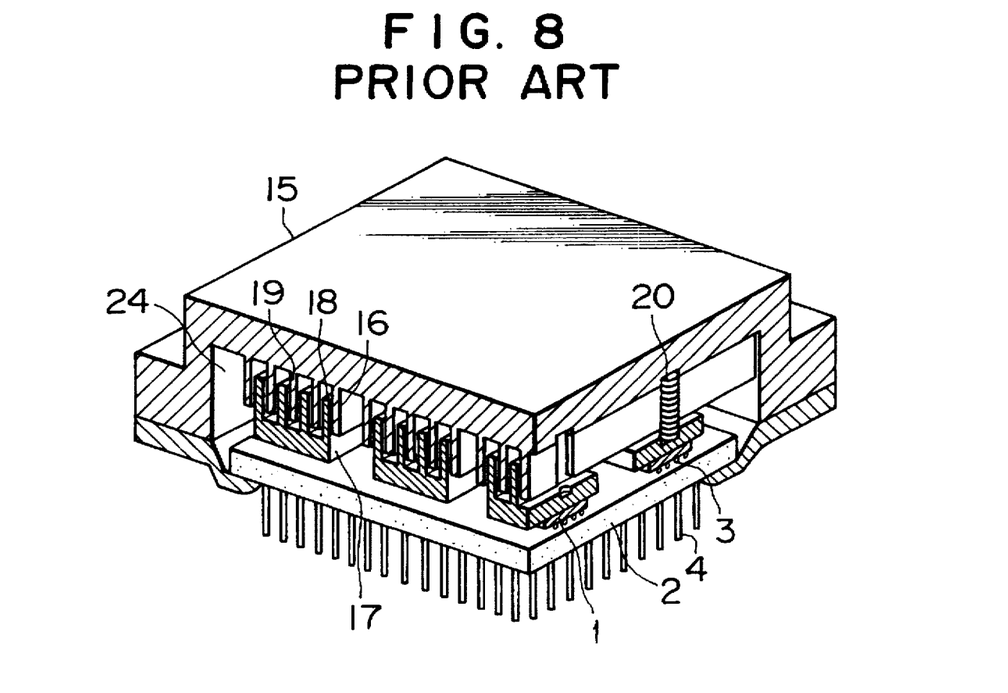
FIG. 8 is a sectional perspective view showing essential portions of another conventional cooling device of a multi-chip module.

As another conventional example, Japanese Patent examined Publication No. 5-78183 discloses a heat conduction path shown in FIG. 8.

A cooling device having this flexible heat conduction path is constructed such that a large number of plate-like fins 16, formed inside a housing 15 to face LSI chips 1, are combined with heat conduction members 17 each having a large number of plate-like fins 18 formed integrally with the base, and a flat base surface of each heat conduction member 17 is pressed against the back surface of the associated LSI chip 1 by means of a spring 20.

In this case, the plate-like fins 16 and 18 are engaged with each other leaving a micro gap 19 between them, and therefore the heat conduction member 17, having the plate-like fins 18 formed integrally therewith, is enabled to move with respect to the housing 15.

Meanwhile, to the LSI chip to be mounted on a multi-layer substrate, a micropackage structure disclosed in Japanese Patent Unexamined Publication No. 62-249429 is applied from the viewpoint of the reliability and the cooling efficiency or performance.

More specifically, in order to protect the LSI chip patterned with micro wiring against the external environment, the LSI chip is hermetically sealed in the micropackage. Further, in order to efficiently transfer the heat generated by the LSI chip to the micropackage, the back surface of the LSI chip is fixedly metallurgically joined to the inner wall surface of the micropackage by means of a highly thermally conductive brazing material (such as solder).

Since higher processing speed is demanded of the recent large-scale computer and super computer, the LSI to be used has been more and more developed to be highly integrated, highly concentrated or increased in heat-generation density and increased in size. For example, it is estimated that the size of LSI chip will reach 15–20 by 15–20 millimeters square and the heat-generation density of LSI chip will reach 50–100 W/cm$^2$.

In a multi-chip module mounted with a large number of such high heat-generation density, large-sized LSI chips, the following problems come to be very serious which have not been so worth considering in the conventional multi-chip module whose LSI chip has been about 10 by 10 millimeters square with a heat-generation density of LSI chip being about 10 W/cm$^2$.

A first problem is that, since the back surface of the LSI chip is fixedly metallurgically joined to the inner wall surface of the micropackage using a high thermal-conductivity brazing material (such as solder), a large amount of warp comes to occur in the micropackage surface.

From the viewpoint of the cooling efficiency or performance, it is a problem to the heat conduction cooling structure, which effects cooling by pressing the heat conduction member against the micropackage surface, that a gap between the contact surfaces of the micropackage and the heat conduction member becomes large due to the warp.

Particularly in the case where heat must be released or dissipated from the limited micropackage surface, the contact surface cannot expand beyond the micropackage surface, and therefore it is a problem in terms of the cooling efficiency or performance that a contact thermal resistance, i.e. thermal resistance at the contact which is relatively high, is present at the portion where the heat is most highly concentrated.

A second problem is that the amount of thermal deformation of the micropackage is increased as the LSI chip is developed to be more highly concentrated in heat-generation density and more increased in size. Owing to the generation of heat by the LSI chip sealed in the micropackage, the temperature distribution of the micropackage becomes uneven and the micropackage is thermally deformed.

In consequence, according to the conventional cooling structure, the gap between the contact surfaces of the micropackage and the heat conduction member is changed to be large. Even if the contact thermal resistance changes slightly, the temperature of the LSI chip changes significantly due to the large amount of heat generated by the LSI chip.

Therefore, it is very difficult to uniformly control the temperature of the LSI chip using the conventional cooling structure. It is important that the temperature of a large number of LSI chips mounted on the multi-chip module be made as uniform as possible from the viewpoint of the electric characteristics.

A third problem is that the heat conduction path, leading from the LSI chip to the cooler provided at the upper part of the housing, is long in the conventional cooling structure. In order to efficiently cool the LSI chip which is highly concentrated in heat-generation density, it is required that the thermal resistance of the heat conduction path be low. It is therefore important to make the heat conduction path short.

Accordingly, all the above conventional technologies involve the problem of LSI cooling efficiency because of a lack of full considerations as to the increase of the heat-generation density and the increase of size of the highly integrated LSI chip.

SUMMARY OF THE INVENTION

An object of this invention is to provide a cooling device of a multi-chip module, which is capable of efficiently cooling highly integrated LSI chips, each hermetically sealed in a micropackage for protection against the external environment, and making the temperature of a number of LSIs uniform. A further object is facilitating the operations of assembly and disassembly of the micropackage while moderating the accuracy of fabricating or finishing and the accuracy of assembling of the cooling device, as well as securing the connection reliability of the micropackage.

Another object of the invention is to provide a cooling device of a multi-chip module, in which a heat conduction member or thermal conductor for efficiently conducting heat generated by the LSI ship has a large contact surface to lower the contact thermal resistance.

A further object of the invention is to provide a cooling device of a multi-chip module, which has a heat conduction structure of an excellent electric insulation.

A further object of the invention is to provide a cooling device of a multi-chip module, which enables high productivity and which can be applied even to a multi-chip module that requires a wide range of cooling capacity, only by exchange of cooler.

In order to achieve the above ends, according to the present invention, there is provided a cooling device of a multi-chip module comprising a large number of micropackages each having an LSI chip hermetically sealed therein, a multi-layer substrate having the micropackages mounted thereon, a housing covering the multi-layer substrate, and heat conduction members provided respectively between the micropackages and the housing for conducting heat generated by the LSI chips to the housing. Each of the micropackages comprises a first heat conduction member having a cap portion for receiving the LSI chip and a first fin, which are made of the same material into one body, and a substrate fixed to the cap portion of the first heat conduction member. Further, each of the LSI chips is mounted on the substrate securely fixed to the cap portion of the first heat conduction member while being fixed at a back surface thereof to an inner surface of the cap portion of the first conduction member. A cooler for finally releasing the heat generated by the LSI chips is formed integrally with the housing of the multi-chip module so as to serve as a constituent part of the housing. Second heat conduction members, each having a second fin and movable with respect to the associated first heat conduction member and the cooler to form a flexible heat conduction path, are disposed respectively in contact relation to the cooler while being engaged with the first heat conduction member through the first and second fins.

An elastic or resilient member is interposed between every pair of mutually engaged first and second heat conduction members, so that the second heat conduction member is kept in pressure contact with a bottom surface of the cooler, serving as an inner wall surface of the housing, by the elastic member.

It is designed that the first and second fins should engage with each other leaving a micro gap between them.

The contact area of each of the second heat conduction members with the bottom surface of the cooler is set to be larger than a size of the micropackage but substantially equal to an area allotted to each of the micropackages on the multilayer substrate.

At least either of the first and second heat conduction members is made of a dielectric material.

According to the present invention, the first heat conduction member for conducting the heat generated by the LSI chip is made of the same material as the micropackage to be integral therewith, and therefore even if the LSI chip is hermetically sealed in the micropackage and the back surface of the LSI chip is fixed to the inner surface of the micropackage, it is possible to eliminate a conventional problem that the contact thermal resistance is increased due to the thermal deformation of the micropackage. Namely, no large contact thermal resistance exists at the portion where the heat is concentrated most, and therefore the thermal resistance is held low and stabilized. Meanwhile, the micropackage and the heat conduction member, which have conventionally been formed separately, can be reduced in thickness into one body, because they are made of the same material, and therefore the thermal resistance to the heat conduction, i.e. resistance to thermal conduction, can be made lower by an amount corresponding to the reduction in thickness.

Further, in the invention, the cooling for finally releasing the heat generated by the LSI chips is formed integrally with the housing of the multi-chip module so as to serve as one of the constituent parts of the housing, and each of the second heat conduction members, provided between the first conduction member and the cooler, is kept in contact with the bottom surface of the cooler, serving as the inner wall surface of the housing, by the elastic member interposed between the first and second heat conduction members so as to be movable with respect to the first heat conduction member and the cooler to form the flexible heat conduction path. According to the invention, therefore, there can be provided a cooling device of a multi-chip module which can facilitate the operations of assembly and disassembly of the micropackage while moderating the accuracy of fabricating or finishing and the accuracy of assembling of the cooling device, as well as securing the connection reliability of the micropackage. It is also possible to cool the LSI chip stably because the heat transfer surface of the second heat conduction member, which is kept in contact with the bottom surface of the cooler, and the bottom surface of the cooler are not affected by thermal deformation.

According to the present invention, the size of the heat transfer surface of the second heat conduction member, which is kept in contact with the bottom surface of the cooler, is larger than that of the micropackage and is substantially equal to an area allotted to each of the micropackages to be occupied thereby on the multi-layer substrate, and therefore the contact thermal resistance between the bottom surface of the cooler and the surface of the second heat conduction member, which are in contact with each other, can be lowered.

According to the invention, the first conduction member, made of the same material as the micropackage to be integral therewith, has the first fin while the second heat conduction member has the second fin, and the first and second fins engage each other leaving a micro gap between them. Therefore, the thermal resistance between the first and second fins can be made low. For this reason, the accuracy of finishing and the accuracy of assembling of the cooling device can be moderated, and the connection reliability of the micropackage can be secured, thereby to facilitate the assembly and disassembly of the micropackage.

According to the invention, at least either of the first and second heat conduction members is made of a dielectric material, and therefore the electric reliability can be secured.

The foregoing and other objects, features and advantages of the invention will be made clearer hereafter from the description of preferred embodiments with reference to the attached drawings.

DESCRIPTION OF THE PREFERRED EMBODIMENTS

A first embodiment of the present invention will be described below in detail with reference to FIGS. 1 to 3.

Figure 1:
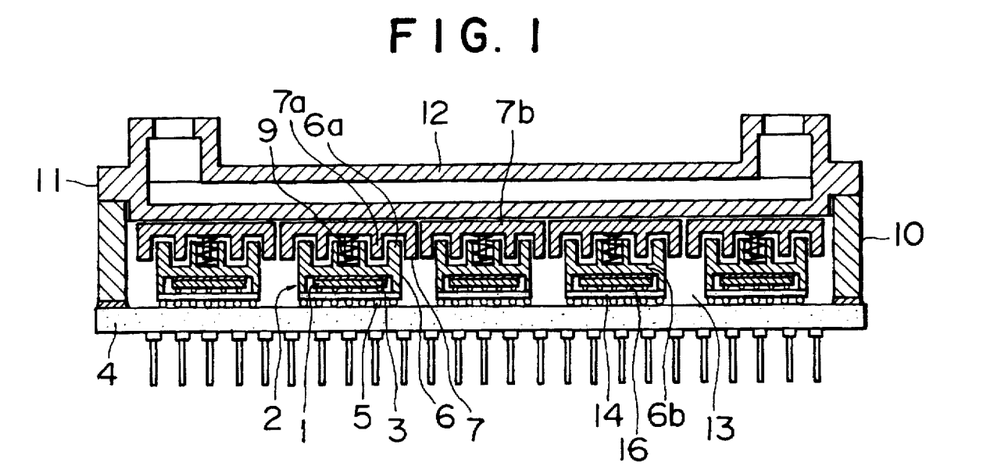
FIG. 1 is a vertical sectional view of a cooling device of a multi-chip module according to a first embodiment of the invention.

FIG. 1 shows in vertical section a structure of a cooling device of a multi-chip module to which the present embodiment is applied.

Figure 2:
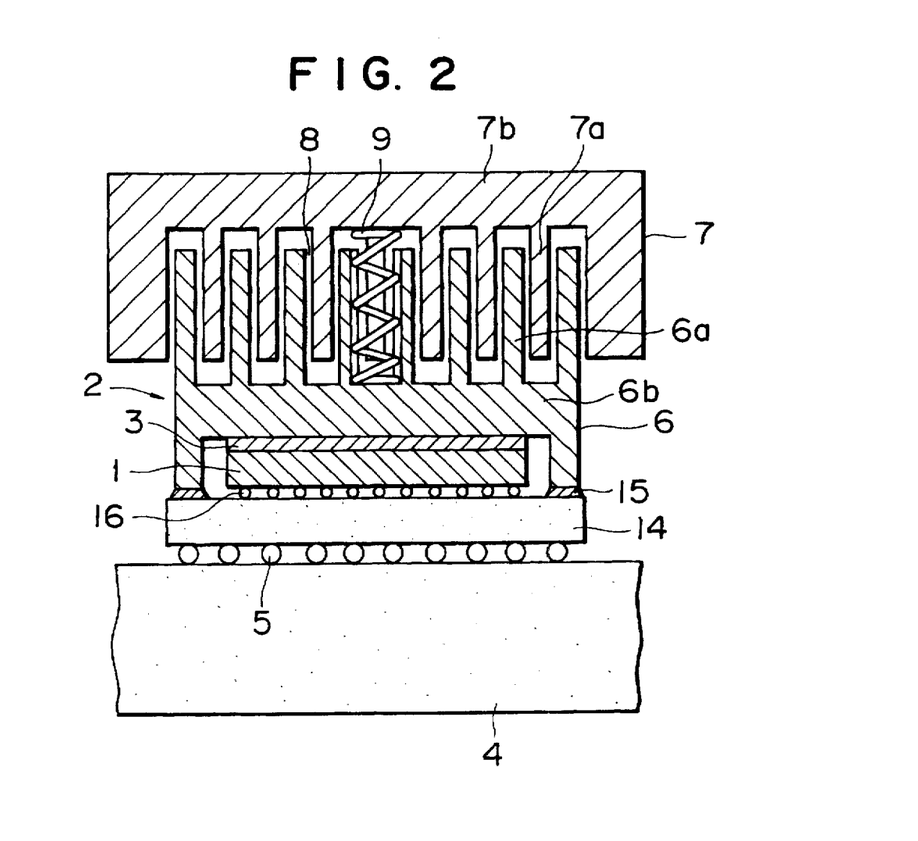
FIG. 2 is a vertical sectional view showing a first heat conduction member and a second heat conduction member of FIG. 1, which engage with each other leaving a micro gap between them.

FIG. 2 shows a vertically-sectioned structure in which a first heat conduction member integral with a micropackage and a second heat conduction member engage with each other, leaving a micro gap between them.

Figure 3:
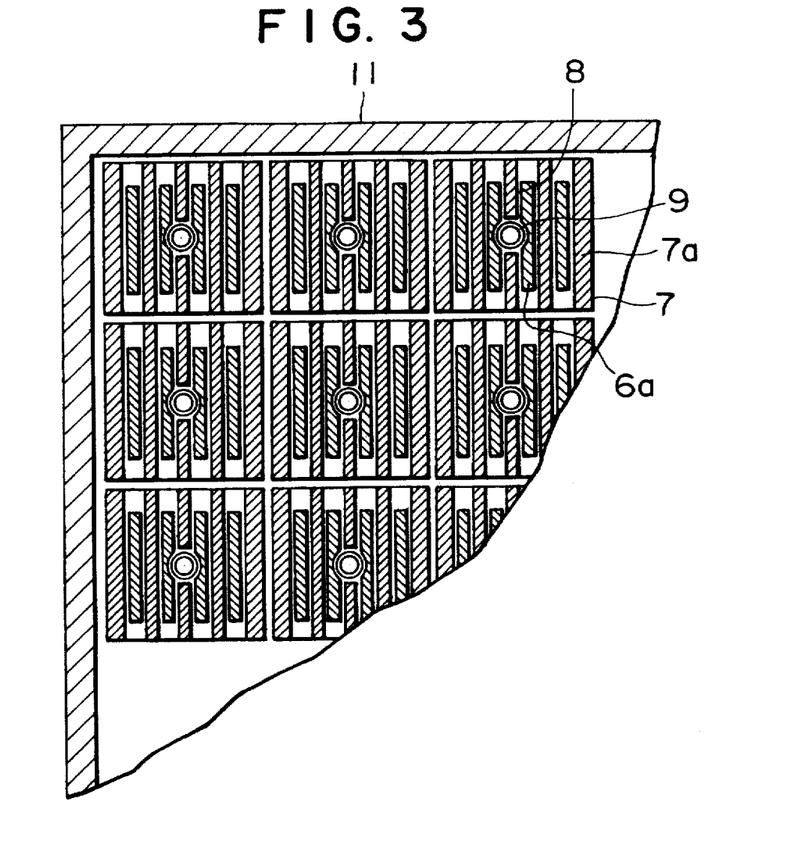
FIG. 3 is a fragmentary cross-sectional view showing essential portions of the cooling device of the multi-chip module of FIG. 1.

FIG. 3 is a cross-sectional view showing essential portions of the cooling device of the multi-chip module shown in FIG. 1.

In the drawings, a multi-chip module 10 has a housing 11 which is so attached as to cover a ceramic multi-layer substrate 4, on which a large number of micropackages 2 each encasing an LSI chip 1 are mounted.

Each of the micropackages 2 is formed by securely fixing the first heat conduction member 6, comprising first fins 6a and a cap portion 6b, to a single- or multi-layer substrate 14, by means of a sealing solder 15.

Each of the micropackages 2 is mounted on the ceramic multi-layer substrate 4 through micro solder balls 5.

The LSI ship 1 is hermetically sealed in the micropackage 2.

In the first thermal conductor or heat conduction member 6 of the micropackage 2, serving to conduct heat generated by the LSI chip 1, the first fins 6a and the cap portion 6b are made of the same material to be integral with each other so as to function as a hermetic seal cap of the micropackage 2.

Furthermore, in order to transfer the heat generated by the LSI chip 1 to the first heat conduction member 6 efficiently, the back surface of the LSI chip 1 is fixedly metallurgically joined to the inner wall surface of the hermetic seal cap of the micropackage 2 by means of a highly thermally conductive brazing material 3 (such as solder).

The LSi chip 1 is mounted on the single- or multi-layer substrate 14 through micro solder balls 16.

It is noted that the outer size of the first heat conduction member 6 is identical with the size of the cap portion 6b of the micropackage 2.

On the other hand, a cooler 12 for finally releasing the heat generated by the LSI chips 1 is formed integrally with the housing 11 of the multi-chip module 10 so as to serve as a constituent part of the housing.

Second thermal conductor or heat conduction members 7 are each provided between the associated first heat conduction member 6 and the cooler 12.

The first heat conduction member 6 of the micropackage 2 is formed with the cap portion 6b and with a plurality of first fins 6a extending from the cap portion 6b and having a plate-like shape, while the second heat conduction member 7 is formed with a fin base 7b and with a plurality of second fins 7a extending from the fin base 7b and having almost the same plate-like shape as the first fins 6a. The fins may have a pin-like shape, a cylindrical shape, a corrugated shape and so on besides the plate-like shape.

The first fins 6a and the second fins 7a engage with each other leaving a micro gap 8 between them.

The first and second heat conduction members 6, 7 are formed at the center thereof with a hole, respectively, and an elastic member 9 is inserted in this hole. In the illustrated embodiment, a spring is used for the elastic member.

Owing to the pushing force applied by the spring 9, a flat surface of the fin base 7b of the second heat conduction member 7 is kept in surface contact with a flat bottom surface of the cooler 12, constituting an inner wall surface of the housing 11.

The fin base 7b of the second heat conduction member 7 has a heat transfer area that is larger than the outer size of the micropackage 2 and is substantially equal to an area allotted to each of the micropackages 2 for the occupancy on the multi-layer substrate 4.

It is preferred that all integral portions of the first heat conduction member 6 of the micropackage 2 that are made of the same material, be made of a material which has a high thermal conductivity and has as conformable or matching a coefficient of linear expansion as possible with the LSI chip 1.

At least either of the first and second heat conduction members 6, 7 must be made of a dielectric material in order to secure electric insulation from the LSI chip 1. Examples of this kind of material include aluminum nitride (AlN) and silicon carbide (SiC).

Within an enclosed or encapsulated space 13 defined by the housing 11 and the multi-layer substrate 4 is sealed a gas of high thermal conductivity such as helium gas or hydrogen gas, a dielectric insulation liquid such as oil, or an inert liquid such as a carbon fluoride type or group coolant or a hydrocarbon halogenide type or group coolant.

In the case where a liquid is sealed in the enclosed space 13, the liquid is sealed in the enclosed space 13 to such an extent as to leave a room for the relief of pressure rise within the enclosed space 13, to allowing the thermal expansion of the liquid upon the rise in temperature.

With the above construction, according to the present embodiment, the heat generated by the LSI chip 1 is efficiently transferred from the cap portion 6b of the first heat conduction member 6 to the first fins 6a thereof, which are made of the same material as the micropackage 2, i.e. cap portion 6b, to be integral therewith, through a short heat conduction path.

The heat is then transferred through a fluid layer in a large number of micro gaps 8 to the second fins 7a of the second heat conduction member 7, and is finally removed or taken away from the fin base 7b of the second heat conduction member 7 by the cooler 12. At this time, owing to the large heat transfer areas of the first and second fins 6a, 7a, the resistance, to the heat conduction, of the fluid layer in the micro gaps 8 is lowered.

In addition, a large contact area is secured between the flat bottom surface of the cooler 12 and the fin base 7b, and the cooler 12 is formed integrally with the housing 11 of the multi-chip module 10 so as to serve as a constituent part of the housing, and therefore the contact thermal resistance can be avoided from being affected by thermal deformation, and can be kept low.

Further, the contact surface between the fin base 7b of the second heat conduction member 7 and the cooler 12 is flat, and therefore the accuracy of surface finishing or machining can be enhanced to a high degree, and accordingly the contact thermal resistance thereof is very low and the operation is effected stably.

Meanwhile, all portions of the first heat conduction member 6 of the micropackage 2 are made of the same material to be integral, and therefore even if the back surface of the LSI chip 1 is fixedly metallurgically joined to the inner wall surface of the hermetic seal cap of the micropackage 2 by the highly thermally conductive brazing material 3 (such as solder), the first heat conduction member 6 acts as mechanical reinforcement to suppress warp and thermal deformation in the micropackage 2.

Besides, the first and second fins 6b and 7b engage with each other leaving the micro gap 8 between them, and therefore the accuracy of finishing and the accuracy of assembling of the cooling device are moderated, and the connection reliability of the micropackage 2 by the micro solder balls 5 is secured. Therefore, operations of assembly and disassembly of the micropackage are facilitated.

As a result, it becomes possible to cool the LSI chip of the multi-chip module in which the size of the LSI chip reaches 15–20 by 15–20 millimeters square and the heat-generation density of LSI chip reaches 50–100 W/cm$^2$, for example.

Figure 4:
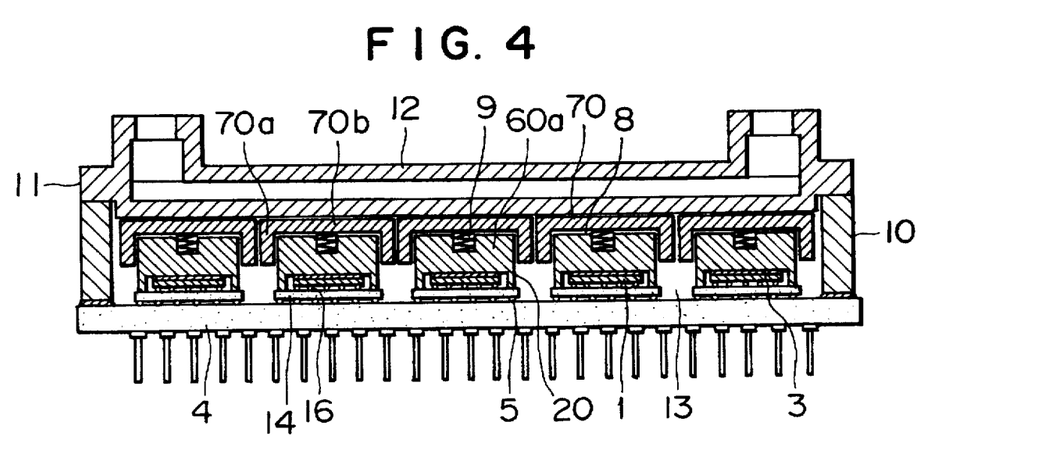
FIG. 4 is a vertical sectional view of a cooling device of a multi-chip module according to a second embodiment of the invention.
Figure 5:
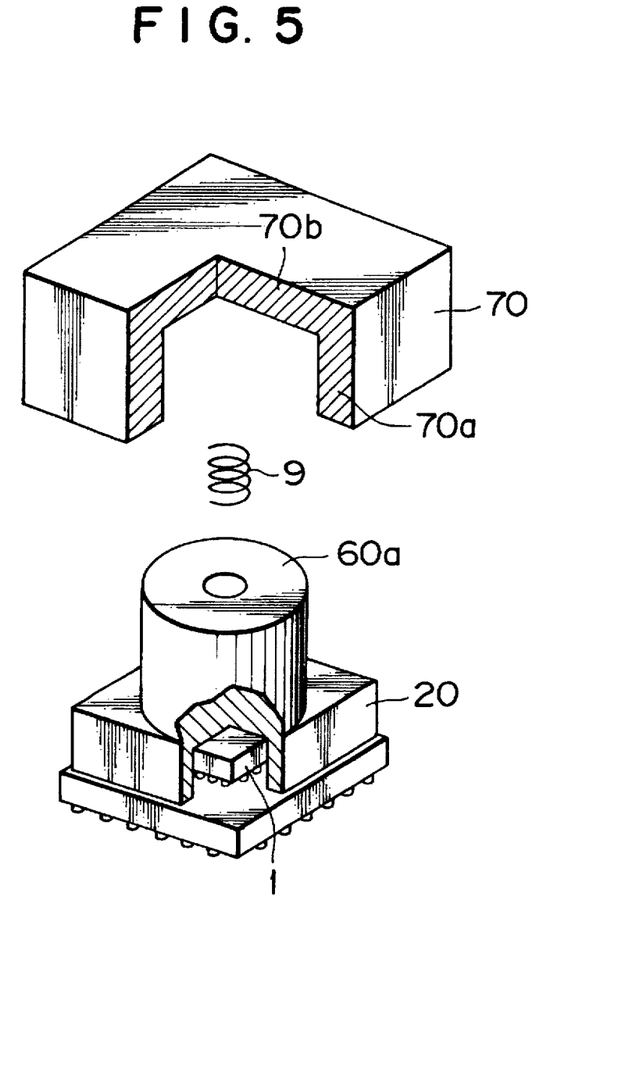
FIG. 5 is a partly-sectioned exploded perspective view showing a first heat conduction member and a second heat conduction member of FIG. 4, which are to be brought into engagement with each other leaving a micro gap between them.

Next, a second embodiment of the invention will be described with reference to FIGS. 4 and 5. In this embodiment, the same components as those shown in FIG. 1 are designated by the same reference numerals and description thereof is omitted.

As shown in the drawing, each micropackage 20 has the same structure as the micropackage 2 (or cap portion thereof) in the first embodiment, but a first heat conduction member 60 thereof comprises a cylindrical fin 60a which is made of the same material as the micropackage 20 to be integral therewith.

Each second heat conduction member 70 is a block having the shape of a rectangular parallelopiped, and comprises a base portion 70b and a central circular cylinder 70a so that the cylindrical fin 60a can be inserted therein.

The cylindrical fin 60a and the circular cylinder 70a engage with each other, leaving a micro gap 8 between them. A spring 9 is inserted in a hole formed in the center of the distal end portion of the cylindrical fin 60a. A flat surface of the base portion 70b of the second heat conduction member 70 is pushed by the spring 9 and kept in surface contact with a bottom surface of a cooler 12 which serves as an inner wall surface of a housing 11.

The base portion 70b of the second heat conduction member 70 has a heat transfer area which is larger than the outer size of the micropackage 20 and is substantially equal to an area allotted to each of the micropackages 20 for occupancy on the multi-layer substrate 4.

With the above construction, according to this embodiment, the heat generated by each of the LSI chips 1 is efficiently transferred to the cylindrical fin 60a of the first heat conduction member 60, made of the same material as (the cap portion of) the micropackage 20 to be integral therewith, through a short heat conduction path. Then, the heat is transferred through a fluid layer in a large number of micro gaps 8 to the second heat conduction member 70, and is finally taken away or removed from the base portion 70b of the second heat conduction member 70 by the cooler 12.

At that time, owing to the large heat transfer areas provided by the outer and inner peripheral surfaces of the cylindrical fin 60a and the circular cylinder 70a, a large contact area provided by the base portion 70b, and elimination of influence of thermal deformation, the resistance to thermal or heat conduction and the contact thermal resistance can be kept low.

Further, all portions of the first heat conduction member 60 of the micropackage 20 are made of the same material to be integral, and therefore even if the back surface of the LSI chip 1 is fixedly metallurgically joined to the inner wall surface of the hermetic seal cap of the micropackage 20 by a highly thermally conductive brazing material 3 (such as solder), the first heat conduction member 60 acts as a high mechanical-strength reinforcement to suppress warp and thermal deformation in the micropackage 20.

The fin 60a and the cylinder 70a engage with each other leaving the micro gap 8 between them, and therefore the accuracy of finishing and the accuracy of assembling of the cooling device are moderated, and the connection reliability of the micropackage 20 by the micro solder balls 5 is secured. Therefore operations of assembly and disassembly of the micropackage are facilitated.

Besides, the fin 60a and the cylinder 70a are both circular in cross-sectional configuration, and therefore a high accuracy of finishing can be easily attained, and the micro gap 8 between the fin 60a and the cylinder 70 engaging with each other can be made smaller correspondingly to a degree of improvement in the accuracy of finishing.

In consequence, it becomes possible to cool the LSI chip of the multi-chip module in which the size of LSI chip reaches 15–20 by 15–20 millimeters square and the thermal density of LSI chip reaches 50–100 W/cm$^2$, for example.

Figure 6:
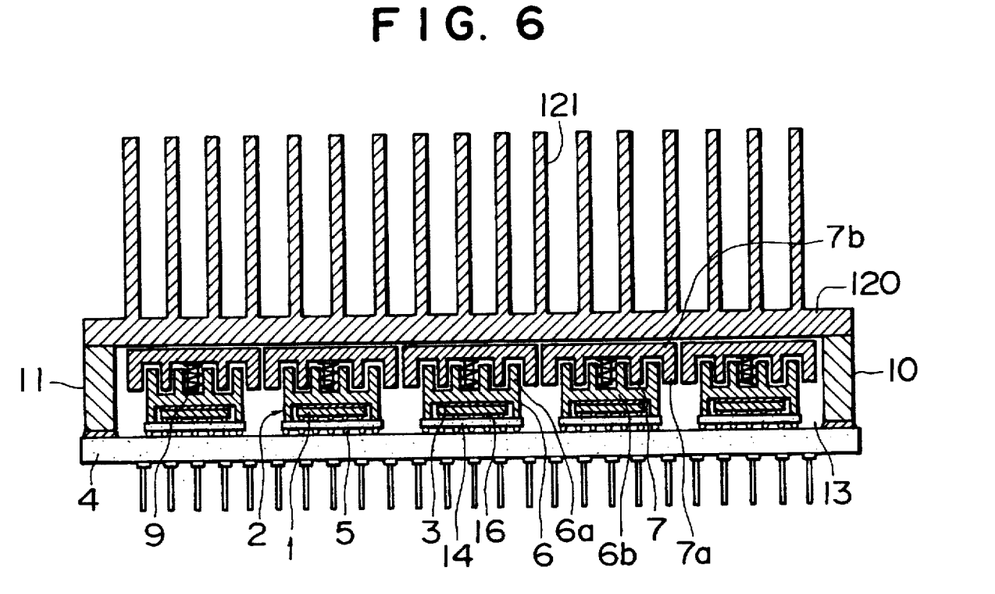
FIG. 6 is a vertical sectional view of a cooling device of a multi-chip module according to a third embodiment of the invention.

Furthermore, a third embodiment of the invention will be described with reference to FIG. 6. In this embodiment, the same components as those shown in FIG. 1 are designated by the same reference numerals and description thereof is omitted.

As shown in the drawing, a cooler 120, formed integrally with a housing 11 of a multi-chip module 10 so as to serve as a constituent part of the housing 11, is of the air-cooled type and is equipped with a large number of air cooling fins 121, differently from the cooler 12 shown in FIG. 1. The present embodiment has the same construction as the above embodiment shown in FIG. 1, except for the cooler 12.

Namely, merely by exchanging the cooler, which finally releases the heat generated by the LSI chips, from the liquid-cooled type (such as water-cooled type), to the air-cooled type, the cooling device of the invention can be applied even to a multi-chip module that requires a wide range of cooling capacity, and the component parts of the cooling device can be made common. Accordingly, there can be provided a cooling device of a multi-chip module which achieves a high productivity and is produced at low cost.

We claim:

1. A cooling device of a multi-chip module, comprising:
   a plurality of micropackages, each having an LSI chip hermetically sealed therein;
   a first substrate having said micropackages mounted thereon;
   a housing covering said first substrate;
   heat conduction members provided respectively between said micropackages and said housing for conducting heat generated by said LSI chips to said housing;
   wherein each of said micropackages includes a first heat conduction member, having a cap portion for receiving said LSI chip and a first fin that is integral with said cap portion and formed of the same material as that of said cap portion, and a second substrate fixed to said cap portion of said first heat conduction member;
   wherein each of said LSI chips is mounted on said second substrate and fixed at a back surface thereof to an inner surface of said cap portion;
   a cooler for finally releasing the heat generated by said LSI chips, wherein said cooler is formed integrally with the housing of the multi-chip module so as to be a constituent part of said housing; and
   second heat conduction members, each having a second fin and being movable with respect to a respective associated first heat conduction member and said cooler to form a flexible heat conduction path, disposed in contact with said cooler, said second heat conduction members being respectively engaged in a heat transfer relationship with said respective associated first heat conduction member through said first and second fins.

2. A cooling device according to claim 1, wherein an elastic member is interposed between every mutually engaged pair of said first and second heat conduction members, so that said second heat conduction member is kept in pressure contact with a bottom surface of said cooler, serving as an inner wall surface of said housing, by said elastic member.

3. A cooling device according to claim 2, wherein each said mutually engaged pair of said first and second fins have a micro gap between them.

4. A cooling device according to claim 2, wherein the contact area of each of said second heat conduction members with the bottom surface of said cooler is larger than a size of said micropackage, and is substantially equal to an area allotted to each of said micropackages on said first substrate.

5. A cooling device according to claim 3, wherein at least either of said first and second-heat conduction members is made of a dielectric material.

6. A cooling device according to claim 1, wherein each said first fin is a cylindrical fin and each said second fin is a hollow cylinder.

7. A multi-chip module, comprising:
   a plurality of micropackages, each having an LSI chip hermetically sealed therein;
   a first substrate having said micropackages mounted thereon;
   a housing covering said first substrate;
   heat conduction members provided respectively between said micropackages and said housing for conducting heat generated by said LSI chips to said housing;
   wherein each of said micropackages includes a first heat conduction member, having a cap portion for receiving said LSI chip and a first fin that is integral with said cap portion and formed of the same material as that of said cap portion, and a second substrate fixed to said cap portion of said first heat conduction member;
   wherein each of said LSI chips is mounted on said second substrate and fixed at a back surface thereof to an inner surface of said cap portion;
   second heat conduction members, each having a second fin and being movable with respect to a respective associated first heat conduction member and said housing to form a flexible heat conduction path, disposed in contact with said housing, said second heat conduction members being respectively engaged in a heat transfer relationship with said respective associated first heat conduction member through said first and second fins.

8. A multi-chip module according to claim 7, wherein said LSI chip is 15–20 by 15–20 millimeters square.

9. A multi-chip module according to claim 7, wherein the heat-generation density of said LSI chips is 5–100 W/cm2.

10. A multi-chip module according to claim 7, further comprising an elastic member interposed between every mutually engaged pair of said first and second heat conduction members, so that said second heat conduction member is kept in pressure contact with an upper inner wall surface of said housing, by said elastic member.

11. A multi-chip module according to claim 7, wherein each said mutually engaged pair of said first and second fins have a micro gap between them.

12. A multi-chip module according to claim 7, wherein the contact area of each of said second heat conduction members with the upper inner wall surface of said housing is larger than a size of said micropackage, and is substantially equal to an area allotted to each of said micropackages on said first substrate.

13. A multi-chip module according to claim 7, wherein at least either of said first and second heat conduction members is made of a dielectric material.

14. A multi-chip module according to claim 7, wherein each said first fin is a cylindrical fin and each said second fin is a hollow cylinder.

* * * * *